United States Patent
Date et al.

(10) Patent No.: US 9,704,293 B2
(45) Date of Patent: Jul. 11, 2017

(54) FINITE ELEMENT MESH CUSTOMISATION (71) Applicant: ROLLS-ROYCE PLC, London (GB)

(72) Inventors: David Leonard Date, Trellech (GB); Ronald Anthony Bates, Wirksworth (GB)

(73) Assignee: ROLLS-ROYCE plc, London (GB)

( * ) Notice: Subject to any disclaimer, the term of this patent is extended or adjusted under 35 U.S.C. 154(b) by 224 days.

(21) Appl. No.: 14/699,655

(22) Filed: Apr. 29, 2015

(65) Prior Publication Data
US 2015/0339851 A1 Nov. 26, 2015

(30) Foreign Application Priority Data
May 20, 2014 (GB) .................................. 1408925.4

(51) Int. Cl.
*G06T 17/20* (2006.01)
*G06F 17/50* (2006.01)
*G06T 19/20* (2011.01)

(52) U.S. Cl.
CPC .......... *G06T 17/20* (2013.01); *G06F 17/5018* (2013.01); *G06T 17/205* (2013.01); *G06T 19/20* (2013.01); *G06T 2219/2021* (2013.01)

(58) Field of Classification Search
CPC ....... G06T 17/205; G06T 19/20; G06T 17/20; G06T 2219/2021; G06F 17/5018
See application file for complete search history.

(56) References Cited

U.S. PATENT DOCUMENTS

| | | |
|---|---|---|
| 5,838,594 A | 11/1998 | Kojima |
| 6,420,698 B1 | 7/2002 | Dimsdale |
| 2004/0189944 A1* | 9/2004 | Kaufman ............... G03B 31/00 352/10 |
| 2004/0194051 A1 | 9/2004 | Croft |

(Continued)

FOREIGN PATENT DOCUMENTS

JP        2002342390 A     11/2002

OTHER PUBLICATIONS

Nov. 17, 2014 Search Report issued in British Application No. GB1408925.04.

(Continued)

*Primary Examiner* — Xiao Wu
*Assistant Examiner* — Chong Wu
(74) *Attorney, Agent, or Firm* — Oliff PLC (57) ABSTRACT

Method of providing the generic finite element mesh; providing a library of displacement shapes of generic mesh, each displacement shape being applicable to the generic mesh to generate altered mesh; providing a set of scanned data points which map the surface of the actual component, each scanned data point defining the spatial position of a respective location on the surface of the actual component; superposing the scanned data points on the surface of generic mesh; projecting scanned data points onto respective proximal surface locations of generic mesh to form a set of near data points, each near data point defining the spatial position of respective location on the surface of the generic mesh; determining a combination of the displacement shapes; and applying the combination of displacement shapes to the generic mesh to generate a customized finite element mesh for the actual component.

11 Claims, 8 Drawing Sheets (56) References Cited

U.S. PATENT DOCUMENTS

2007/0229498 A1 10/2007 Matusik et al.
2008/0294401 A1* 11/2008 Tsin .................... G06F 17/5095
　　　　　　　　　　　　　　　　　　　703/8

OTHER PUBLICATIONS

Staten et al., "A Comparison of Mesh Morphing Methods for 3D Shape Optimization," Proceedings of the 20th International Meshing Roundtable, pp. 293-311, 2012.
Takayama et al., "GeoBrush: Interactive Mesh Geometry Cloning," Computer Graphics Forum, vol. 30, No. 2, Apr. 28, 2011, pp. 613-622.
Oct. 29, 2015 Search Report issued in European Patent Application No. 15 16 5566.

* cited by examiner

FINITE ELEMENT MESH CUSTOMISATION

FIELD OF THE INVENTION

The present invention relates to a method of generating a customised finite element mesh for a component.

BACKGROUND OF THE INVENTION

Finite element analysis (FEA) is widely used to model and solve engineering problems relating to complex systems such as three-dimensional non-linear structural design and analysis. FEA derives its name from the manner in which the geometry of the object under consideration is specified. Basically, FEA computer software is provided with a model of the geometric description and the associated material properties at each point within the model. In this model, the geometry of the system under analysis is represented by solids, shells and beams of various sizes, which are called elements. The vertices of the elements are referred to as nodes. The model is comprised of a finite number of elements, which are assigned a material name to associate the elements with the material properties. The model thus represents the physical space occupied by the object under analysis along with its immediate surroundings. The FEA software then refers to a table in which the properties (e.g. stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

A requirement for successful FEA is a finite element mesh which reproduces the component accurately and in particular has sufficient density of elements at critical locations to model essential features of the problem, but not so high a density of elements that unnecessary detail is modelled and the computer processor is overburdened. Further, the elements should exhibit acceptable quality measures such as low skewnesses, low aspect ratios, and smooth size transitions from element to element. Particularly in respect of complex-shaped components, such as gas turbine engine (GTE) blades and vanes, a considerable amount of effort can thus go into meshing the component.

A typical process for developing and manufacturing a component involves iterative rounds of computer aided design (CAD) and FEA, until a final design is arrived at that can go into testing or manufacture. However, due to manufacturing variability and tolerances the actual manufactured examples may differ in shape from the nominal shape of the FEA mesh used during the development phase. The mesh can be considered as a generic representation of a nominal component, with actual manufactured examples of the component displaying shape variation relative to that generic mesh. The shape variation can be measured by various known metrology techniques such as optical (e.g. laser) scanning, touch probe measurements, computed tomography etc.

If the variations are small, then the differences between the generic mesh and the actual components may be immaterial. However, if the variations are not small a problem can then arise that FEA performed on the generic mesh may not accurately model the actual components. A similar problem occurs if it is wanted to use FEA to quantify the effect of shape variations between actual components. For example, if a frequency prediction of a property of a manufactured component differs from a test of that property, it is helpful to know how much of that difference can be attributed to nominal versus manufactured shape deviations.

One approach to address the problem is simply to distort the generic mesh to the shape of the actual component. However, a simple distortion can reduce the quality of the mesh, e.g. by increasing element skewnesses and aspect ratios, and disturbing smooth size transitions. Another approach is not to use the generic mesh to model the actual component, but rather to re-mesh each time an actual component is to be modelled. However, re-meshing can be labour intensive and time-consuming. Further, for valid comparisons between analyses of different actual components it is desirable that the meshes for the different analyses are fundamentally similar rather than each being the result of a fresh re-mesh.

SUMMARY OF THE INVENTION

Accordingly, a first aspect of the present invention provides a method of generating a customised finite element mesh for a component which is an actual example of a nominal component represented by a generic finite element mesh, the actual component displaying shape variation relative to the generic finite element mesh, the method including steps of:
  providing the generic finite element mesh;
  providing a library of displacement shapes of the generic mesh, each displacement shape being applicable to the generic mesh to generate an altered mesh;
  providing a set of scanned data points which map the surface of the actual component, each scanned data point defining the spatial position of a respective location on the surface of the actual component;
  superposing scanned data points on the surface of the generic mesh;
  projecting the scanned data points onto respective proximal surface locations of the generic mesh to form a set of near data points, each near data point defining the spatial position of the respective location on the surface of the generic mesh;
  determining a combination of the displacement shapes which substantially removes the shape variation by reducing or eliminating deviations between scanned data points and their corresponding near data points; and
  applying the combination of displacement shapes to the generic mesh to generate a customised finite element mesh for the actual component.

In addition, if the method is used to generate customised meshes for plural actual components which are all examples of a single nominal component represented by the generic mesh, then the resulting customised meshes will be fundamentally similar (e.g. in terms of element quantity, type, density etc.), allowing comparisons to be made between analyses performed using the meshes.

In a further aspect, the present invention provides a process for analysing a component which is an actual example of a nominal component represented by a generic finite element mesh, the actual component displaying shape variation relative to the generic finite element mesh, wherein the process includes steps of:
  performing the method according to the first aspect to generate a customised finite element mesh for the actual component; and
  performing finite element analysis of the actual component using the customised mesh.

The process can be performed for each of a plurality components which are actual examples of the nominal component, and the results of the finite element analyses can then be compared.

Further aspects of the present invention provide: a computer program comprising code which, when run on a computer, causes the computer to perform the method of the first aspect; a computer readable medium storing a computer program comprising code which, when run on a computer, causes the computer to perform the method of the first aspect; and a computer system programmed to perform the method of the first aspect.

For example, a computer system can be provided for generating a customised finite element mesh for a component which is an actual example of a nominal component represented by a generic finite element mesh, the actual component displaying shape variation relative to the generic finite element mesh, the system including:

- a computer-readable medium or media storing (i) the generic finite element mesh, (ii) a library of displacement shapes of the generic mesh, each displacement shape being applicable to the generic mesh to generate an altered mesh, and (iii) a set of scanned data points which map the surface of the actual component, each scanned data point defining the spatial position of a respective location on the surface of the actual component; and
- one or more processors configured to: (i) superpose the mapped surface of the actual component on the surface of the generic mesh, (ii) project the scanned data points onto respective proximal surface locations of the generic mesh to form a set of near data points, each near data point defining the spatial position of the respective location on the surface of the generic mesh, (iii) determine a combination of the displacement shapes which substantially removes the shape variation by reducing or eliminating deviations between scanned data points and their corresponding near data points, and (iv) apply the combination of displacement shapes to the generic mesh to generate a customised finite element mesh for the actual component. The system thus corresponds to the method of the first aspect. The system may further include: a display device(s) for displaying any one or more of: the generic finite element mesh, the set of scanned data points, the set of near data points, and the customised finite element mesh.

Optional features of the invention will now be set out. These are applicable singly or in any combination with any aspect of the invention.

Preferably, each displacement shape generates a corresponding altered mesh which has characteristic length scales for any curvatures introduced by its alteration or distortion which are greater than the corresponding characteristic lengths of the elements of the generic mesh. Such a displacement shape can be termed an "allowed" displacement shape. Conversely, a "disallowed" displacement shape has a short characteristic length scale which induces high curvature in the deformation field, resulting in deformation that can unacceptably degrade usability of the final customised finite element mesh. Allowed displacement shapes can conveniently be created by performing a series of FE analyses on the generic mesh to create displaced meshes. Because such shapes are created via FE analyses, they are often plausible shapes for mesh customisation. Displacement shapes can also be combined with smooth mathematical functions operating on the nodes of the generic mesh. Shapes derived in this way can also be allowed displacement shapes. By using such procedures, the library of shapes can be increased rapidly in a way that is independent of the starting shape of the generic mesh without large effort from a user.

In the determining step, the combination of displacement shapes can conveniently minimise a residual which is a measure of total deviation between the scanned data points and their corresponding near data points. For example, the residual can be minimised by a least squares analysis.

The method may further include a step, before the determining step, of: selecting, from the library of displacement shapes, a subset of candidate displacement shapes which, when individually applied to the generic mesh, best reduce or eliminate deviation between scanned data points and their corresponding near data points; wherein, in the determining step, a combination of the candidate displacement shapes is applied to the generic mesh to generate the customised finite element mesh. In this way, the library can contain a repository of all potentially useful displacement shapes for the generic mesh. However, rather than trying to determine the combination of displacement shapes from the entire library of displacement shapes, a preliminary selection of candidate displacement shapes can be made to reduce the computational burden of the determining step.

When the method includes the selecting step, it may further include repeating the selecting and determining steps in an iterative process to reduce or eliminate the deviations between scanned data points and their corresponding near data points. If successive such iterations fail to reduce the deviations sufficiently, the library of displacement shapes can be expanded to include additional displacement shapes representative of the remaining deviations. The selecting and determining steps can then be iteratively repeated again.

The method may further include a step of: providing each near data point with a respective weighting value which quantifies the degree of importance attached to eliminating deviation between that near data point and its corresponding scanned data point; wherein, in the determining step, reduction or elimination of deviation is prioritised for near data points with higher weighting values. For example, in respect of a component which is a GTE blade or vane, higher weighting values may be given to regions such as leading and trailing edges which can be critical for subsequent FEA, but which may be relatively sparse in scanned data points.

The method may further include a preliminary step of: scanning the actual component (e.g. by optical scanning, touch probe measurements, computerised tomography etc.) to form the set of scanned data points.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES OF THE INVENTION

The ensuing description provides preferred exemplary embodiment(s) only, and is not intended to limit the scope, applicability or configuration of the invention. Rather, the ensuing description of the preferred exemplary embodiment(s) will provide those skilled in the art with an enabling description for implementing a preferred exemplary embodiment of the invention, it being understood that various changes may be made in the function and arrangement of elements without departing from the scope of the invention.

Specific details are given in the following description to provide a thorough understanding of the embodiments. However, it will be understood by one of ordinary skill in the art that embodiments maybe practiced without these specific details. For example, well-known circuits, processes, algorithms, structures, and techniques may be shown without unnecessary detail in order to avoid obscuring the embodiments.

Also, it is noted that embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

As disclosed herein, the term "computer readable medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium such as storage medium. A processor(s) may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

1 Overview

The need to transfer as-manufactured or as-measured component shapes into design and analysis systems is increasingly important. For example, when a frequency prediction differs from a test, it can be important to know how much of the difference can be attributed to nominal-to-manufactured shape deviations.

There are a number of existing routes to shape recovery. Most, however, are limited by being: component specific, labour intensive, unable to cope with large data sets, and restricted to external surface morphologies only.

Desirable attributes of a shape recovery system are that:
It should have an ability to cope with complex internal features (e.g. turbine blades) or multiply connected solids (e.g. vaned structures);
It should have an ability to process data from various sources such as optical scanning, touch probe measurements, computerised tomography, and computationally (e.g. principle component analysis) derived point clouds;
It should allow repeated processes to be scripted so that any labour intensive or skilled processes are one-offs; and
It should provide a customised mesh that avoids degrading mesh distortions and preserves mesh topology.

2 Outline of Method

Figure 1:
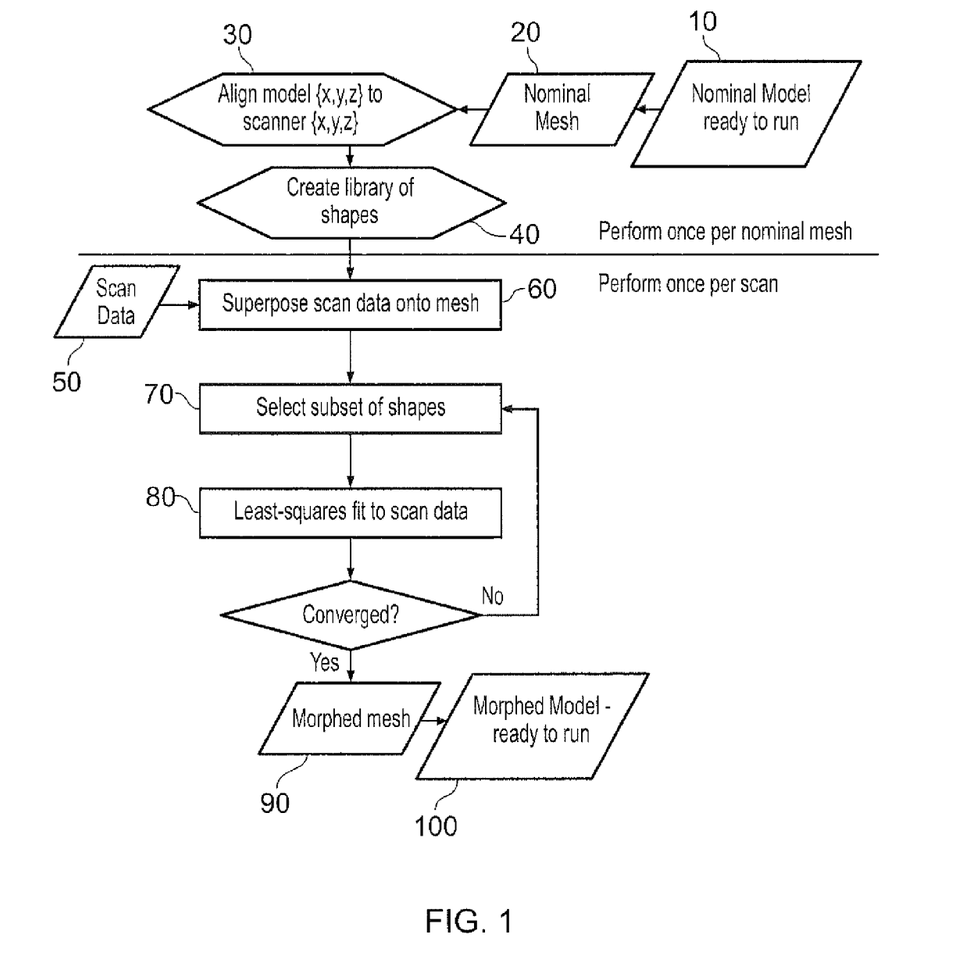
FIG. 1 shows a flow chart of a method of generating a customised finite element mesh.

FIG. 1 shows a flow chart of a method of generating a customised finite element mesh for a component which is an actual example of a nominal component represented by a generic finite element mesh.

The starting points of the method are: a finite element (FE) model 10 of the nominal component, the model providing a generic finite element mesh 20; a library 40 of allowed displacement shapes of the generic mesh; and a set of scanned data points 50 which map the surface of the actual component. Optionally the mesh coordinates of the mesh can be aligned 30 to that of a measurements scanner so that in a subsequent superposition stage (discussed below), the scan data and mesh are automatically aligned An alteration or "morph" of the generic (typically 3D and $2^{nd}$ order geometry-faithful) solid finite element (FE) mesh 20 is sought that causes the surface of the morphed FE solid to approximate to a scanned point cloud that defines a measured surface of an actual component. A first stage is to superpose 60 the scanned point cloud onto the surface of the generic mesh. A second stage is to deform the generic mesh to improve the fit to the scanned point cloud. The deformation procedure can be made robust and automatic, regardless of mismatch between nominal and scanner axis systems, by iteratively morphing the generic mesh using only combinations of known smooth displacement shapes. Within the iteration, a dot-product technique can be used to select 70 a "shortlist" of candidate basic displacement shapes that can provide a best fit. A linear combination of these (the composite displacement shape) can be determined by least squares 80. The selection 70 and determination 80 stages can be repeated to improve the fit to the scan data. The finally determined combination of displacement shapes is then used to morph the mesh 90, which is then in a customised form ready to be used in FE analysis 100 of the actual component.

Advantageously the time-consuming stages of the creation of the generic mesh 20 and the creation of the library 40 of displacement shapes only need to be performed once for a given generic mesh.

3 Detailed Methods 3.1 Creating Library of Displacement Shapes

An objective is to prepare a standardised set of allowed basic displacement shapes in the nominal model's global coordinates. These can be arrays (three real numbers per FE mesh node) stored as 2D data items. The shapes are defined as "allowed" because they are created by performing FE analyses on the generic mesh to create displaced meshes, and thus are plausible shapes for mesh customisation. In particular, mesh quality sufficient for analysis is likely to be maintained as any distortion introduced by the allowed displacement shapes is unlikely to result in increased curvature of mesh elements which could unacceptably degrade usability of the final customised mesh. The shapes can also be combined with smooth mathematical functions (see the next section) operating on the mesh nodes. Such derived shapes are also deemed to be allowed displacement shapes.

One or more analysis models may be required to form the shapes. The analysis models can start with modal analysis (free-free with no restraints, fixed modes with restraints at appropriate places) and continue to include (but not limited to) mechanical (linear static, nonlinear), thermal and even combined thermo-mechanical analysis with any appropriate combination of boundary conditions (restraints and loads). A set of basic analyses can be applied automatically as a batch process to generate a basic library of shapes that the user then augments with specific analyses suitable for the problem at hand.

A total of 50-100 basic displacement shapes may be adequate for most components.

3.2 Basic Scaling Factor Fields

A standardised library of basic scaling factor fields can also be prepared. These are mathematical functions on the mesh nodes that distort the mesh. Examples are radial expansion (or stretching), stretching of the model along principal axes (x,y,z).

Basic scaling factor fields can be grouped in categories (mutually exclusive sets). Then entries from each category can be multiplied together, squared, rooted etc. to produce a large number of derived scaling factor fields. All the fields should desirably be smooth, i.e. not induce any high curvature that could unacceptably degrade usability of the final customised mesh.

3.3 Point Proximity

When the scanned data points are superposed on the surface of the generic mesh, a near data point on the surface of the generic mesh is determined for each scanned data point. This can be achieved by projecting each scanned data point to the closest position of the surface of the generic mesh. In the following, these closest positions are termed "near points".

3.4 Weighting Factor Fields

Some surfaces of the component may have to be replicated more accurately than others in the final customised mesh. To achieve this, the near points of such surfaces can be given higher weightings than those of other surfaces. Similarly, some surfaces may be sparsely scanned compared to other surfaces, and the near points of these sparsely scanned can also be given higher weightings to compensate for the sparsity. As explained below, the weightings can be used to preferentially bias reduction or elimination of shape variation to those surfaces having near points with higher weightings.

The weightings are in effect a user-specified scalar field.

3.5 Intrinsic Coordinates and Near Point Displacements

Each time a basic displacement shape or basic scalar factor field is applied to the generic mesh, the displacements produced by that shape/field have to be calculated at the near points. This can be achieved by interpolating the global coordinates of the near point into the intrinsic coordinates of the respective FE element on which that near point resides, before applying the shape/field to the generic mesh.

3.6 Nomenclature

User supplied basic displacement shapes and basic scaling factor fields are permuted in the code to generate, transiently, many factored displacement shapes, of which the best fitting are picked to be candidate displacement shapes. A linear combination of candidate displacement shapes gives the composite displacement shape that is used to update the nodal coordinates in the FE solid.

There are m scanned data points, subscripted j.

There are n candidate displacement shapes, subscripted k. At various times these may be unscaled shapes or scaled/factored shapes.

$\overline{NG_j}$ Nominal-to-scan relative position 3-vector i.e. from the $j^{th}$ near point to the $j^{th}$ scan point $\overline{ng_j}$ unit 3-vector in direction from the $j^{th}$ near point to the $j^{th}$ scan point $P_j = |\overline{NG_j}|$ proximity of the $j^{th}$ scan point from the surface of the generic FE mesh (the "near point")

$w_j$ relative importance of the $j^{th}$ scan point (user specified scalar field evaluated at the near point, default=1)

$\overline{p}$ m-vector of all proximities $\overline{p} = \overline{P}/|\overline{P}|$ m-vector of all proximities $\overline{DK_j}$ 3-vector of the $K^{th}$ candidate displacement shape at the $j^{th}$ near point, each component having been shape function interpolated from nodal values $PK_j = \overline{DK_j} \cdot \overline{ng_j}$ change in proximity at the $j^{th}$ near point due to applying the $K^{th}$ candidate displacement shape (sign convention: +ve means gets closer)

$\overline{PK}$ m-vector of all changes in proximity due to applying the $K^{th}$ candidate displacement set, can be termed the $k^{th}$ deviation reduction m-vector q is the (weighted if required) sum of squares of distances of scan points from surface after applying a linear combination of all n candidate displacement shapes 3.7 Identification of Candidate Displacement Shapes An aim is to create, test and discard large numbers of basic displacement shapes and basic scaling factor fields in order to identify a smaller subset of most suitable candidate displacement shapes. The total number of shapes tested can be increased by applying more scaling factor fields to each basic displacement shape.

The following algorithm can be applied, where NB is the number of basic scalar factor fields (subscripted "if"), NS is the number of displacement shapes in the library (subscripted "is"), m is the number of near points, and NF is the number of derived scalar factor fields (generated by combining two or more basic scalar factor fields into a new field)

Interpolate all NB scalar factor fields from generic mesh nodes to all m near points
Create a three column array "rdot" with three columns, NS*NF rows and the array entries set to zero
Loop over all is = 1 to NS displacement shapes
  Loop over all j = 1 to m near points -continued

```
Interpolate displacement shapes from nodes to generic mesh nodes
   to near points to get $\overline{DB_j}$ and $PS_j=\overline{DB}j \cdot \overline{ng}_j$, $\overline{DB_j}$ being the 3-vector
   of the $B^{th}$ displacement shape at the jth near point, each component
   having been shape function interpolated from nodal values
Endloop
Loop over all if = 1 to NF derived scalar factor fields
   Loop over all j = 1 to m near points
      $PF_j = f1_j{}^* f2_j{}^* f3_j{}^* f4_j{}^* PS_j$ is the component of the respective
         derived scalar factor field in the nominal-to-scan direction at the
         $j^{th}$ near point
      Cumulate $\Sigma_{j-1}{}^m PF_j{}^2$
   Endloop near points
   Cumulate $|\overline{PF}|= \sqrt{\Sigma_{j-1}{}^m PF_j{}^2}$
   Set relmag = 0
   If $|\overline{PF}|$> a user-specified threshold tolerance value then
      Cumulate $\overline{pf}=\overline{PF}/|\overline{PF}|$ to normalise the m-vector PF
      relmag $=\overline{p}.\overline{pf}$ is a relative magnitude and is measure of how
         well the "shape" of this trial candidate displacement set matches
         the "shape" of the scanned data points
   Endif
   Store into the respective row of the rdot array: {is,if,relmag}
Endloop derived scalar factor fields
Endloop displacement shapes
Sort the rdot array on the third column in descending order of relmag
```

Each row of the array is thus a combination of a basic displacement shape and a derived scalar factor field, with the top row being highest ranked and the bottom row being lowest ranked. The first n rows of the array thus provide a subset of n candidate displacement shapes for fitting to the scanned point cloud.

A pre-fitting check can be performed to test for linear independence of the candidate displacement shapes. For example, the dot products of each of the candidate shapes with all the other candidate shapes can be calculated. If a given dot product is close to one (e.g. >0.999), then the two shapes are not independent, and the lower ranked of the two can be rejected.

3.8 Removal of Shape Variation

A linear combination of the n candidate displacement shapes which provides a best fit to the scanned data points (taking account of any weightings) can be determined by the least squares method. More particularly:

$$q=\Sigma_{j=1}^{m} w_j\{(P_j - a_1 P1_j - a_2 P2_j \ldots -a_k PK_j \ldots -a_n PN_j)^2\}$$

where $a_k$ is the coefficient to be applied to the $K^{th}$ displacement set. For q to be a minimum:

$$\frac{\partial q}{\partial a_1} = 0, \frac{\partial q}{\partial a_2} = 0 \ldots$$

Differentiating by the chain rule and re-arranging leads to:

$$\frac{\partial q}{\partial a_1}: a_1 \sum_{j=1}^{m} w_j P1_j^2 + a_2 \sum_{j=1}^{m} w_j P1_j P2_j +$$

$$a_3 \sum_{j=1}^{m} w_j P1_j P3_j + \ldots + a_n \sum_{j=1}^{m} w_j P1_j PN_j = \sum_{j=1}^{m} w_j P1_j P_j$$

$$\frac{\partial q}{\partial a_2}: a_1 \sum_{j=1}^{m} w_j P2_j P1_j + a_2 \sum_{j=1}^{m} w_j P2_j^2 + a_3 \sum_{j=1}^{m} w_j P2_j P3_j +$$

$$\ldots + a_n \sum_{j=1}^{m} w_j P2_j PN_j = \sum_{j=1}^{m} w_j P2_j P_j$$

$$\frac{\partial q}{\partial a_3}: a_1 \sum_{j=1}^{m} w_j P3_j P1_j + a_2 \sum_{j=1}^{m} w_j P3_j P2_j + a_3 \sum_{j=1}^{m} w_j P3_j^2 +$$

$$\ldots + a_n \sum_{j=1}^{m} w_j P3_j PN_j = \sum_{j=1}^{m} w_j P3_j P_j$$

$$\ldots$$

$$\frac{\partial q}{\partial a_n}: a_1 \sum_{j=1}^{m} w_j PN_j P1_j + a_2 \sum_{j=1}^{m} w_j PN_j P2_j +$$

$$a_3 \sum_{j=1}^{m} w_j PN_j P3_j + \ldots + a_n \sum_{j=1}^{m} w_j PN_j^2 = \sum_{j=1}^{m} w_j PN_j P_j$$

This is a readily solvable (n×n) set of equations for coefficients of $a_k$. The result is a linear combination of candidate displacement shapes which substantially removes the shape variation between the actual component and the generic mesh by reducing or eliminating deviations between scanned data points and their corresponding near data points.

The identification of candidate shapes and determination of the linear combination which provides a best fit to the scanned data points can be repeated to converge the aggregated residual error, q, to a value. If this value is sufficiently low, the finally determined linear combination of displacement shapes can then be applied to generate a customised mesh, as described below. However, if the value of q is not low enough, then the library can be expanded to include new shapes that are representative of the required displacement.

3.9 Customised Mesh

Finally, the linear combination of displacement shapes gives a composite displacement shape that is applied to the generic mesh to morph the mesh and thereby generate a customised mesh for the actual component.

4 Example

FIGS. 2 to 8 illustrate the method described above applied to a component which is a compressor blade of a gas turbine engine.

Figure 2:
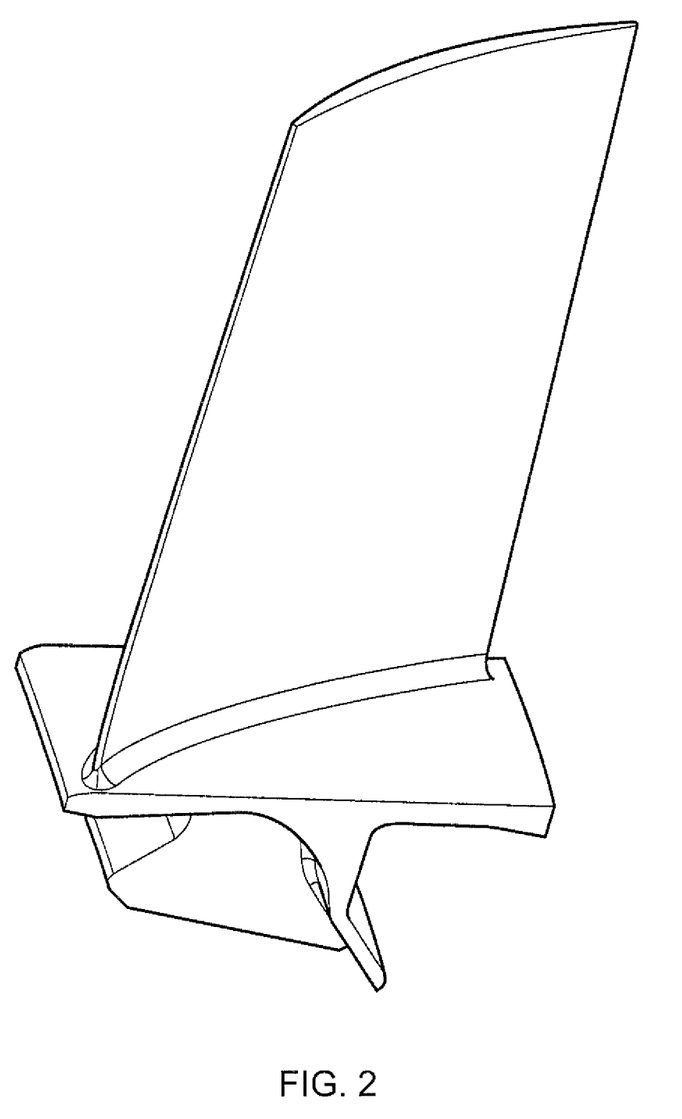
FIG. 2 shows an image of a compressor blade of a gas turbine engine.
Figure 3:
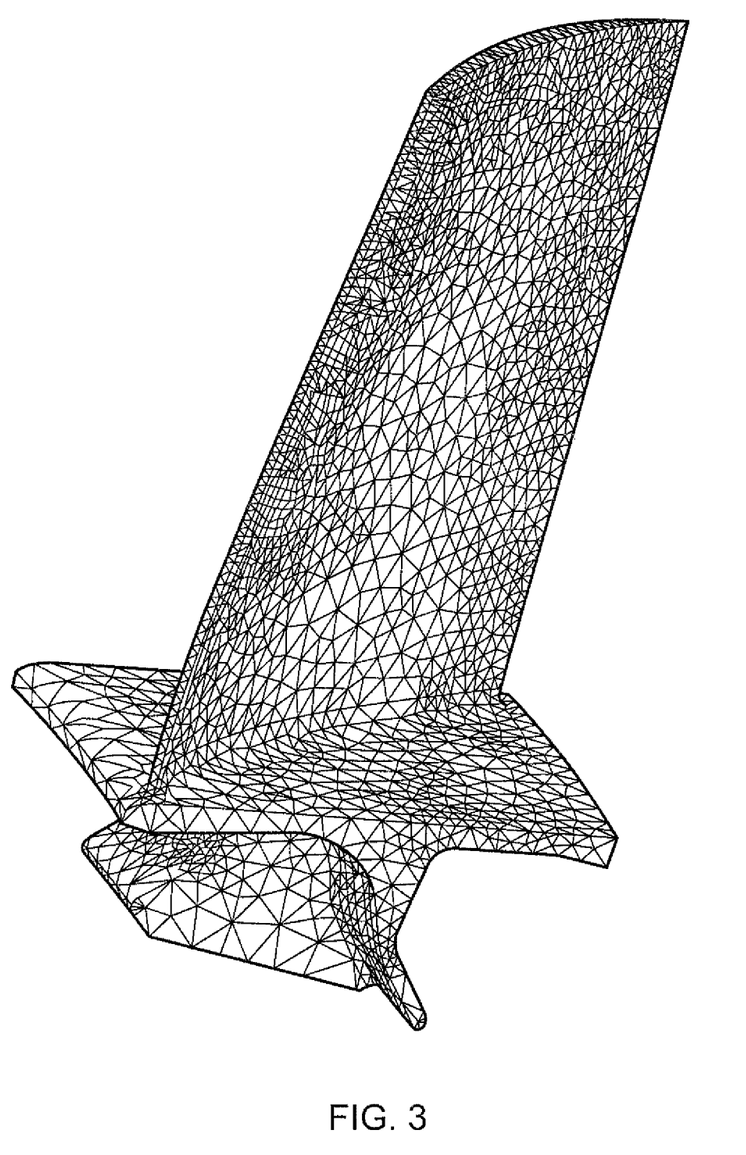
FIG. 3 shows a finite element mesh of the blade.
Figure 4:
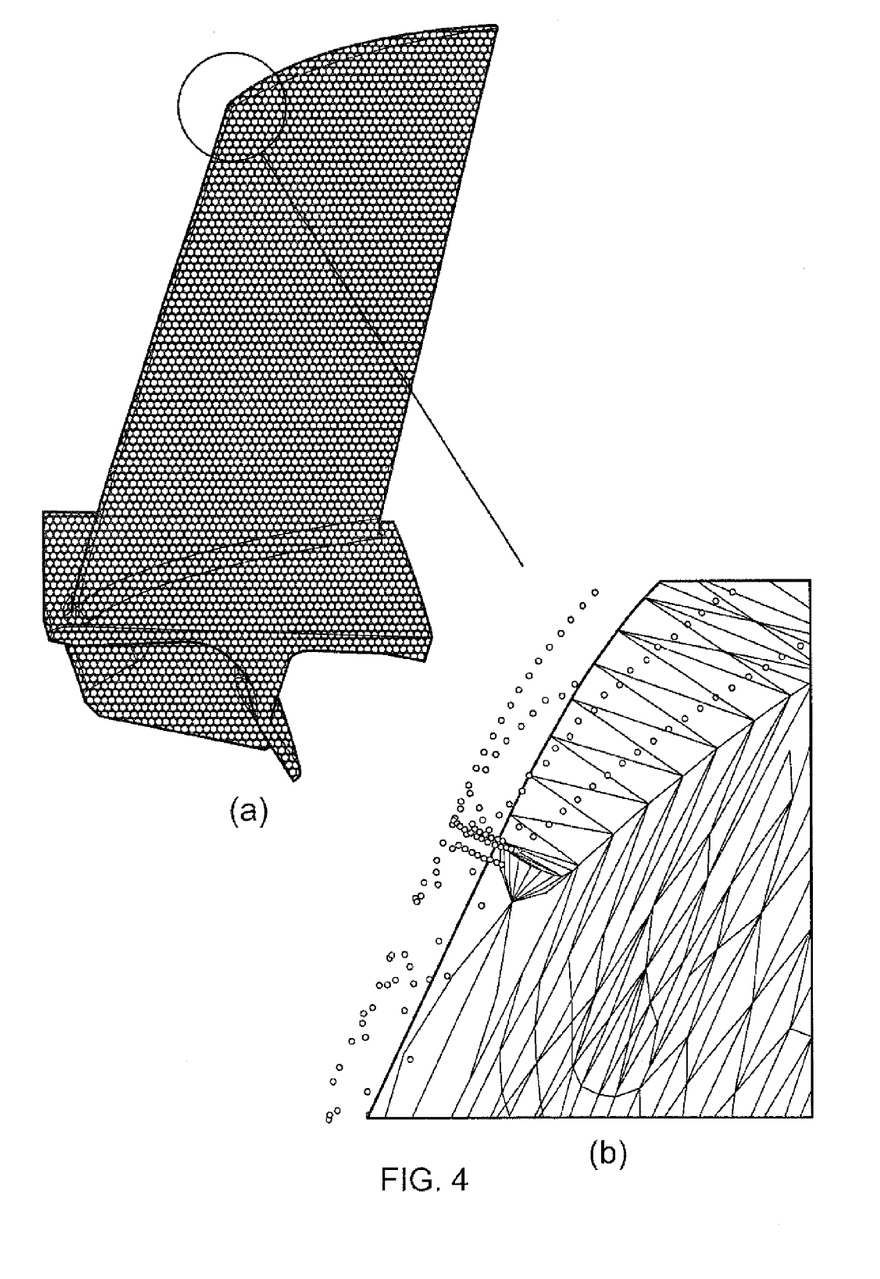
FIG. 4 shows (a) dummy scanned data points superposed on the mesh of FIG. 3, and (b) a close-up view of the mesh and data points at the junction of the leading edge and tip.

FIG. 2 shows an image of the blade, and FIG. 3 shows an FE mesh of the blade. This mesh was deformed by modal analysis and scalar fields. The mesh element vertices were then taken as dummy scanned data points. FIG. 4(a) shows the dummy scanned data points superposed on the undeformed mesh of FIG. 3, with FIG. 4(b) a close-up view of the undeformed mesh and data points at the junction of the leading edge and tip.

Figure 5:
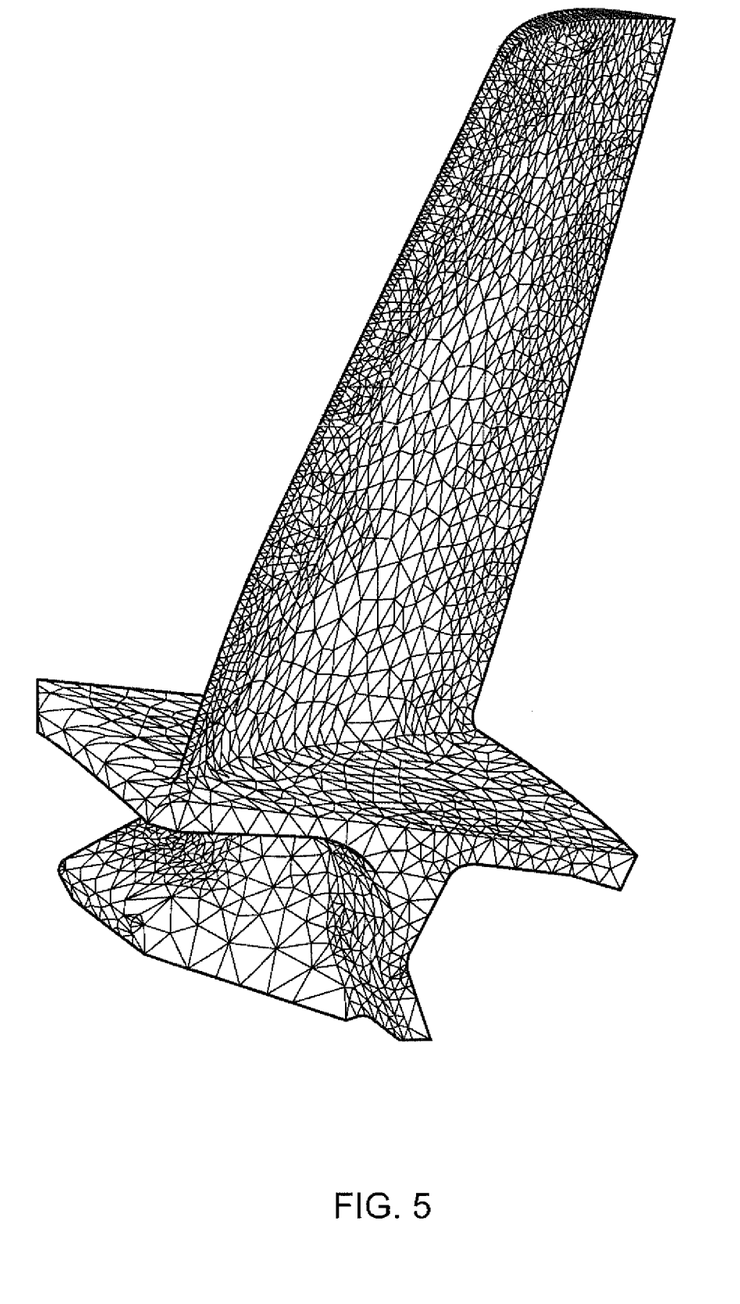
FIG. 5 shows a new finite element mesh for the blade of FIG. 3.
Figure 6:
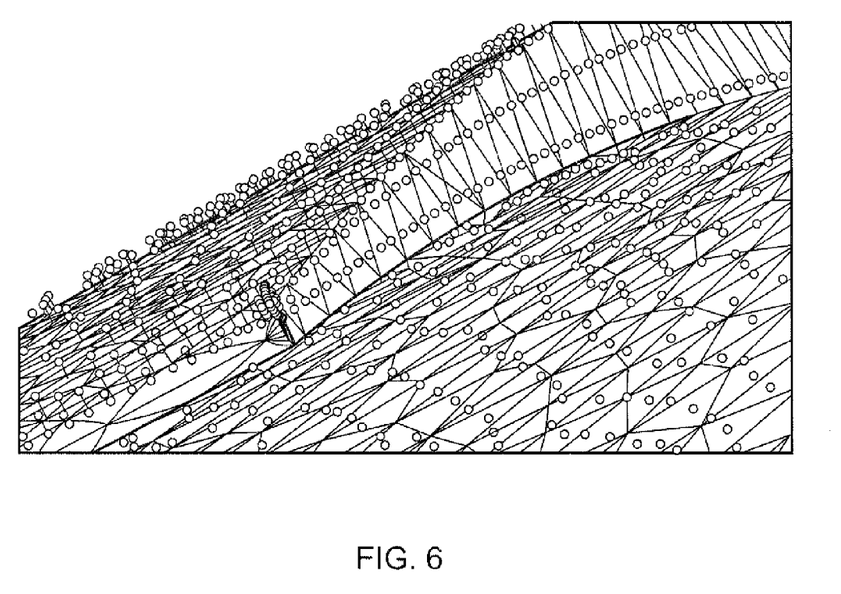
FIG. 6 shows a close-up view of the new mesh and the dummy scanned data points at the junction of the leading edge and tip of the new mesh, as well as near points corresponding to the projections of the dummy scanned data points onto the surface of the new mesh.
Figure 7:
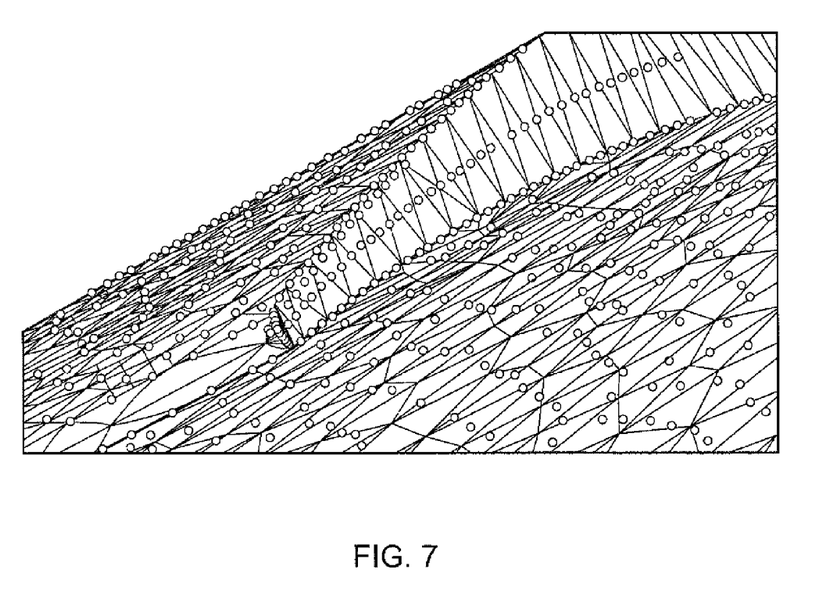
FIG. 7 shows a close-up view of a customised finite element mesh, the dummy scanned data points and the near points at the junction of the leading edge and tip of the customised mesh.

A completely new FE mesh for the undeformed blade was then produced, as shown in FIG. 5. The dummy scanned data points were superposed on this mesh, FIG. 6 showing the superposed dummy scanned data points at the junction of the leading edge and tip of the new undeformed mesh. Also shown in FIG. 6 are the near points corresponding to the projections of the dummy scanned data points onto the surface of the new undeformed mesh. In FIG. 6, the dummy scanned data points are shown in light grey, and the near points are dark grey and lie on the surface of the solid.

Figure 8:
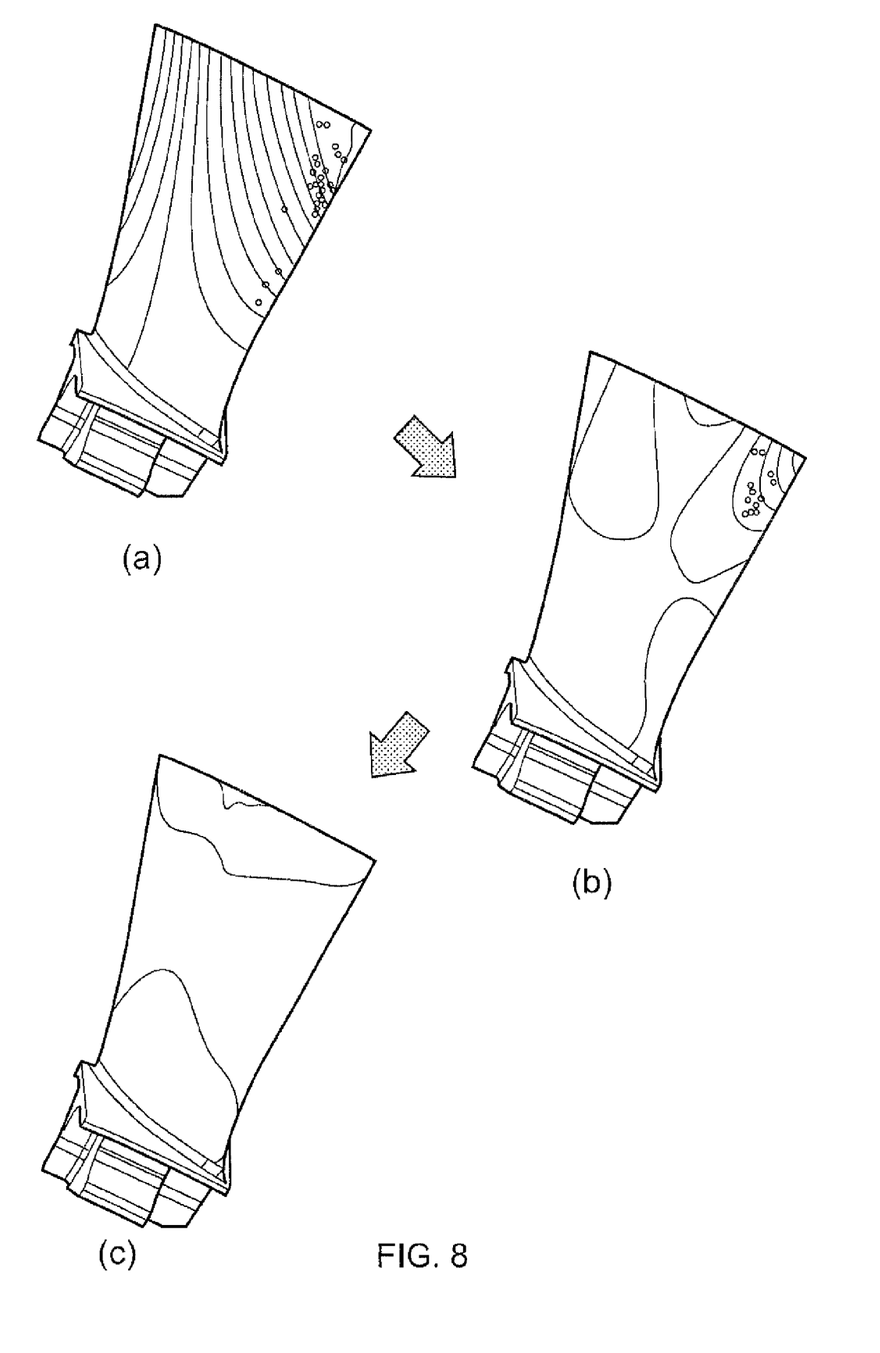
FIG. 8 shows the error between (a) the new mesh and the dummy scanned data points at the start of the process, (b) an intermediate mesh and the dummy scanned data points after a first pass, and (c) the customised mesh and the dummy scanned data points after a second and final pass.

A library of displacement shapes was created and, using the method described above, a combination of shapes was found that removed the shape variation of the original deformation by reducing or eliminating deviations between the dummy scanned data points and their corresponding near data points. The combination of displacement shapes was then applied to the new un-deformed mesh to generate a customised finite element mesh for the deformed blade, shown in FIG. 7, still superposed by the dummy scanned data points and the corresponding near points. FIG. 8 shows the error between (a) the new un-deformed mesh and the dummy scanned data points at the start of the process, (b) an intermediate mesh and the dummy scanned data points after an initial identification of candidate shapes and linear combination determination, and (c) the customised mesh and the dummy scanned data points after refinement by a second identification of candidate shapes and linear combination determination.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

The invention claimed is:

1. A method of generating a customised finite element mesh for a component which is an actual example of a nominal component represented by a generic finite element mesh, the actual component displaying shape variation relative to the generic finite element mesh, the method including steps of:
   providing the generic finite element mesh;
   providing a library of displacement shapes of the generic mesh, each displacement shape being applicable to the generic mesh to generate an altered mesh;
   providing a set of scanned data points which map the surface of the actual component, each scanned data point defining the spatial position of a respective location on the surface of the actual component;
   superposing the scanned data points on the surface of the generic mesh;
   projecting the scanned data points onto respective proximal surface locations of the generic mesh to form a set of near data points, each near data point defining the spatial position of the respective location on the surface of the generic mesh;
   determining a combination of the displacement shapes which substantially removes the shape variation by reducing or eliminating deviations between scanned data points and their corresponding near data points; and
   applying the combination of displacement shapes to the generic mesh to generate a customised finite element mesh for the actual component; wherein
      each displacement shape from the library of displacement shapes generates a corresponding altered mesh which has characteristic length scales for any curvatures introduced by its alteration which are greater than the corresponding characteristic lengths of the elements of the generic mesh.

2. A method according to claim 1, wherein, in the determining step, the combination of displacement shapes minimises a residual which is a measure of total deviation between the scanned data points and their corresponding near data points.

3. A method according to claim 1, further including a step, before the determining step, of:
   selecting, from the library of displacement shapes, a subset of candidate displacement shapes which, when individually applied to the generic mesh, best reduce or eliminate deviation between scanned data points and their corresponding near data points;
   wherein, in the determining step, a combination of the candidate displacement shapes is applied to the generic mesh to generate the customised finite element mesh.

4. A method according to claim 3, wherein the selecting and determining steps are repeated iteratively to reduce or eliminate the deviations between scanned data points and their corresponding near data points.

5. A method according to claim 1, further including a step of:
   providing each near data point with a respective weighting value which quantifies the degree of importance attached to eliminating deviation between that near data point and its corresponding scanned data point;
   wherein, in the determining step, reduction or elimination of deviation is prioritised for near data points with higher weighting values.

6. A method according to claim 1, further including a preliminary step of:
   creating the library of displacement shapes by performing a series of predetermined finite element analyses on the generic mesh.

7. A method according to claim 1, further including a preliminary step of:
   scanning the actual component to form the set of scanned data points.

8. A process for analysing a component which is an actual example of a nominal component represented by a generic finite element mesh, the actual component displaying shape variation relative to the generic finite element mesh, wherein the process includes steps of:
   performing the method according to claim 1 to generate a customised finite element mesh for the actual component; and
   performing finite element analysis of the actual component using the customised mesh.

9. A process for analysing components which are actual examples of a nominal component represented by a generic finite element mesh, the actual components displaying shape variations relative to the generic finite element mesh, wherein the process includes steps of:
   performing the process according to claim 8 for each of the actual components; and
   comparing the results of the finite element analyses.

10. A non-transitory computer readable medium having stored therein a computer program comprising code which, when run on a computer, causes the computer to perform the method of claim 1.

11. A computer system comprising at least one processor or circuit configured to perform the method of claim 1.

* * * * *